Figure 1:
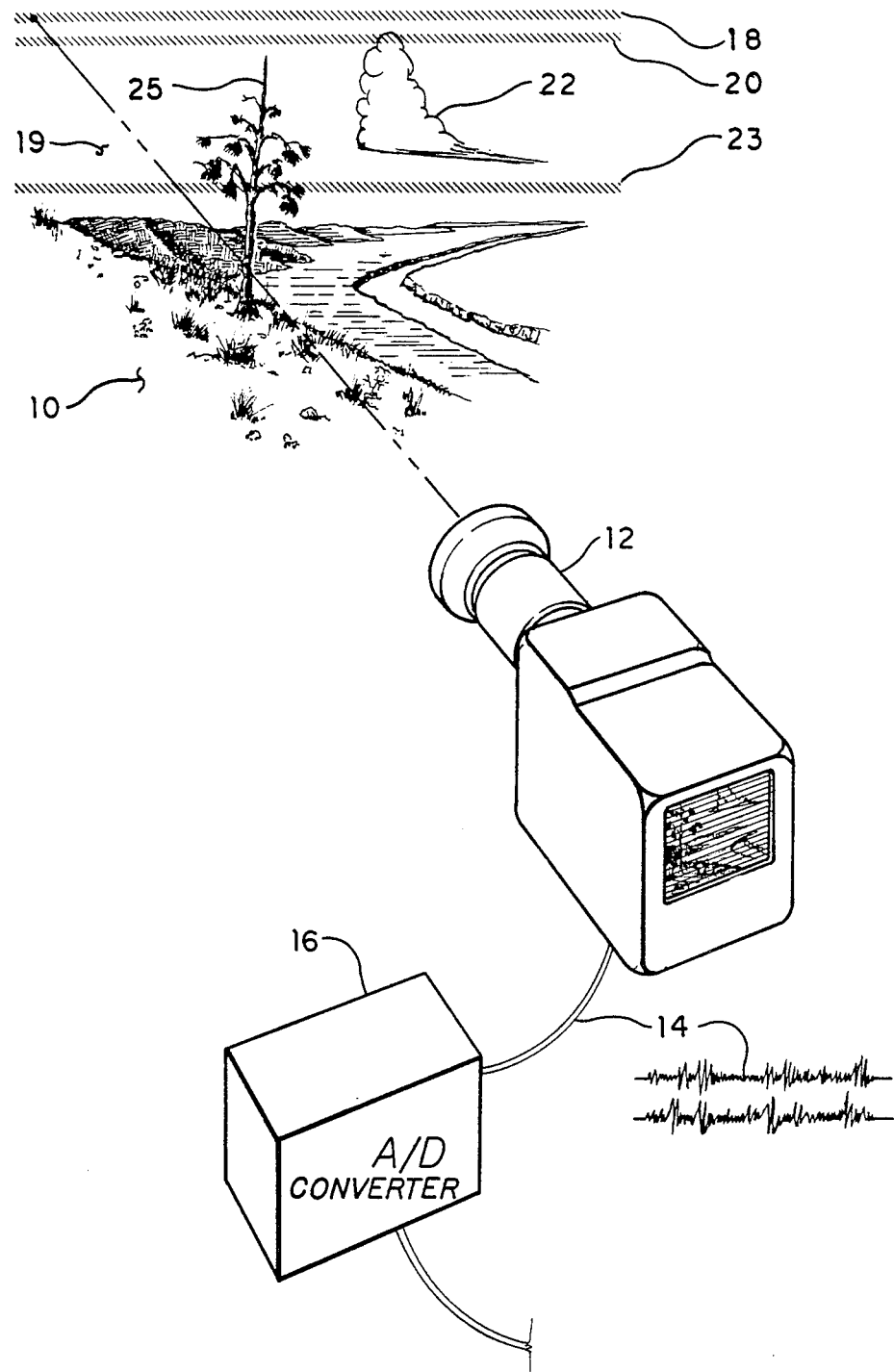

United States Patent [19]

Lin

[11] Patent Number: 4,761,782
[45] Date of Patent: Aug. 2, 1988

[54] ERROR CORRECTION OF DIGITAL IMAGE DATA BY MEANS OF IMAGE REDUNDANCY

[75] Inventor: Shaw-Yueh Lin, Encinitas, Calif.

[73] Assignee: Eastman Kodak Company, Rochester, N.Y.

[21] Appl. No.: 23,327

[22] Filed: Mar. 9, 1987

[51] Int. Cl.$^4$ ............................................. G06F 11/00
[52] U.S. Cl. ........................................ 371/30; 371/36
[58] Field of Search ...................... 371/37, 38, 39, 40, 371/36, 31, 53, 57, 65, 72, 30; 358/256, 260, 263, 166, 167, 141; 360/9.1, 38.1; 382/56, 57; 375/31

[56] References Cited

U.S. PATENT DOCUMENTS

| | | | |
|---|---|---|---|
| 4,369,463 | 1/1983 | Anastassiou | 358/260 X |
| 4,498,104 | 2/1985 | Schulz | 371/31 X |
| 4,607,290 | 8/1986 | Murakami | 371/37 X |

Primary Examiner—Jerry Smith
Assistant Examiner—Robert W. Beausoliel
Attorney, Agent, or Firm—Daniel Robbins

[57] ABSTRACT

The sample values of a digitized image are encoded utilizing the amount of redundancy in the digital data to generate check bits which are attached to blocks of the data prior to transmission or recording. After transmission or recording, the recovered data is re-encoded using the original encoding rules, and any resultant errors which have changed the redundancy are reflected in the re-encoded check bits. The original check bits attached to the data are compared to the re-encoded check bits to determine if the errors are correctable, and, if so, what steps must be taken to correct the errors and to restore the original redundancy to the recovered data. Two implementations for the practice of the invention are presented. One utilizes a majority rule applied to the data values of the block wherein data values in error in the block are forced into agreement with the majority data values, and the second implementation effects the correction when two of the data values are identical by forcing those data values in error in the block into agreement with the two identical data values.

20 Claims, 16 Drawing Sheets

| S1*,S0* ↓ | | | | |
|---|---|---|---|---|
| 1,1 | 0,0 | 0,1 | 1,0 | 1,1 |
| 1,0 | 0,1 | 0,0 | 1,1 | 1,0 |
| 0,1 | 1,0 | 1,1 | 0,0 | 0,1 |
| 0,0 | 1,1 | 1,0 | 0,1 | 0,0 |
| S1R,S0R → | 1,1 | 1,0 | 0,1 | 0,0 |

FIG. 4

| S1*,S0* ↓ | | | | |
|---|---|---|---|---|
| 1,1 | | | | |
| 1,0 | (0,1)<br>3MSB | | | |
| 0,1 | (1,0)<br>2MSB,3MSB | (1,1)<br>2MSB | | |
| 0,0 | (1,1)<br>1MSB,2MSB<br>3MSB | (1,0)<br>1MSB,2MSB | (0,1)<br>1MSB | |
| S1R,S0R → | 1,1 | 1,0 | 0,1 | 0,0 |

FIG. 5

| LINE OUTPUT | P1j·P2j | P1j·P3j | P1j·P4j | P1j·P5j | P2j·P3j | P2j·P4j | P2j·P5j | P3j·P4j | P3j·P5j | P4j·P5j |
|---|---|---|---|---|---|---|---|---|---|---|
| (1) | — | O | O | O | O | O | O | O | O | O |
| (2) | O | — | O | O | O | O | O | O | O | O |
| (3) | O | O | — | O | O | O | O | O | O | O |
| (4) | O | O | O | — | O | O | O | O | O | O |
| (5) | O | O | O | O | — | O | O | O | O | O |
| (6) | O | O | O | O | O | — | O | O | O | O |
| (7) | O | O | O | O | O | O | — | O | O | O |
| (8) | O | O | O | O | O | O | O | — | O | O |
| (9) | O | O | O | O | O | O | O | O | — | O |
| (10) | O | O | O | O | O | O | O | O | O | — | j=1  1MSB
j=2  2MSB
j=3  3MSB

FIG. 13

| CONDITIONS | P1P2 | P1P3 | P1P4 | P1P5 | P2P3 | P2P4 | P2P5 | P3P4 | P3P5 | P4P5 |
|---|---|---|---|---|---|---|---|---|---|---|
| (1) | 1 | 1 | 1 | 1 | 1 | 1 | 1 | 1 | 1 | 1 |
| (2) | 0 | 0 | 0 | 0 | 0 | 0 | 0 | 0 | 0 | 0 |
| (3) | 0 | 1 | 1 | 0 | 0 | 1 | 1 | 1 | 1 | 1 |
| (4) | 1 | 0 | 1 | 0 | 1 | 0 | 1 | 1 | 0 | 1 |
| (5) | 1 | 1 | 0 | 1 | 1 | 0 | 0 | 0 | 1 | 0 |
| (6) | 1 | 1 | 1 | 0 | 0 | 1 | 0 | 0 | 0 | 0 |
| (7) | 0 | 0 | 0 | 0 | 0 | 0 | 0 | 0 | 0 | 0 |
| (8) | 0 | 0 | 0 | 0 | 0 | 1 | 1 | 1 | 1 | 1 |
| (9) | 0 | 0 | 0 | 0 | 1 | 0 | 1 | 1 | 0 | 0 |
| (10) | 0 | 0 | 0 | 1 | 1 | 1 | 0 | 0 | 0 | 1 |
| (11) | 0 | 0 | 1 | 1 | 0 | 0 | 0 | 0 | 1 | 0 |
| (12) | 0 | 1 | 0 | 1 | 0 | 0 | 0 | 1 | 0 | 0 |
| (13) | 0 | 1 | 1 | 0 | 0 | 0 | 1 | 0 | 0 | 0 |
| (14) | 1 | 0 | 0 | 1 | 0 | 1 | 0 | 0 | 0 | 0 |
| (15) | 1 | 0 | 1 | 0 | 1 | 0 | 0 | 0 | 0 | 0 |
| (16) | 1 | 1 | 0 | 0 | 1 | 0 | 0 | 0 | 0 | 0 |
| (17) | N | N | 0 | 0 | N | 0 | 0 | 0 | 0 | 1 |
| (18) | N | 0 | N | 0 | 0 | N | 0 | 1 | 1 | 0 |
| (19) | N | 0 | 0 | N | 0 | 0 | N | 0 | 0 | 0 |
| (20) | 0 | N | N | 0 | 0 | 0 | 1 | N | N | 0 |
| (21) | 0 | N | 0 | N | 0 | 1 | 0 | 0 | 0 | N |
| (22) | 0 | 0 | N | N | 1 | 0 | 0 | 0 | 0 | 0 |
| (23) | 0 | 0 | 0 | 1 | N | N | 0 | N | N | 0 |
| (24) | 0 | 0 | 1 | 0 | N | 0 | N | 0 | N | N |
| (25) | 0 | 1 | 0 | 0 | 0 | N | N | N | 0 | N |
| (26) | 1 | 0 | 0 | 0 | 0 | 0 | 0 | N | N | N |

FIG. 15

ERROR CORRECTION OF DIGITAL IMAGE DATA BY MEANS OF IMAGE REDUNDANCY

BACKGROUND OF THE INVENTION

1. Field of the Invention

This invention relates to error correction of digital data, and in particular to correction of digital data representing a pictorial image.

Figure 2A:
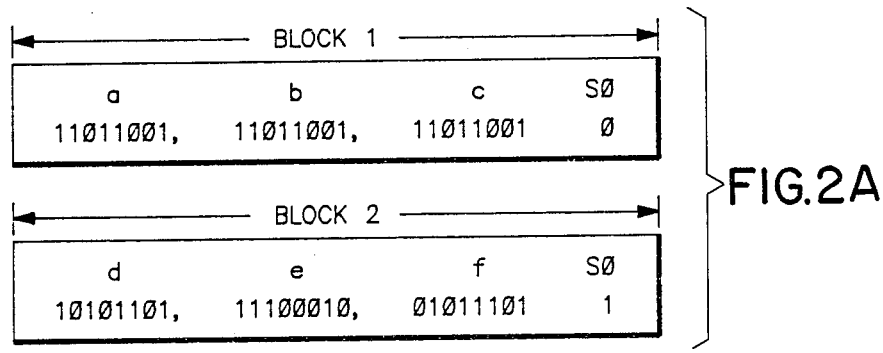
Figure 2B:
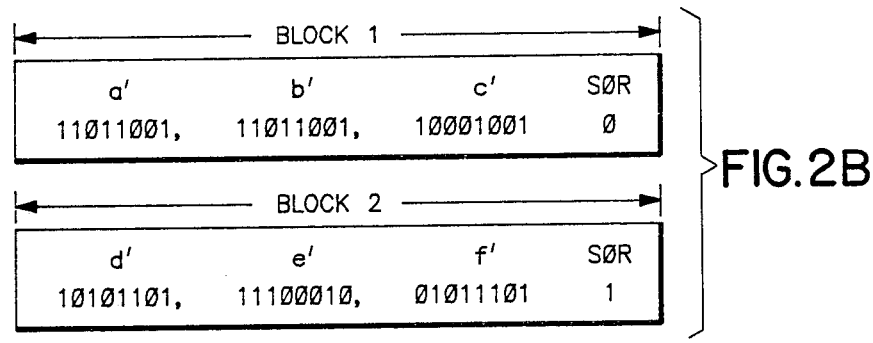
Figure 3:
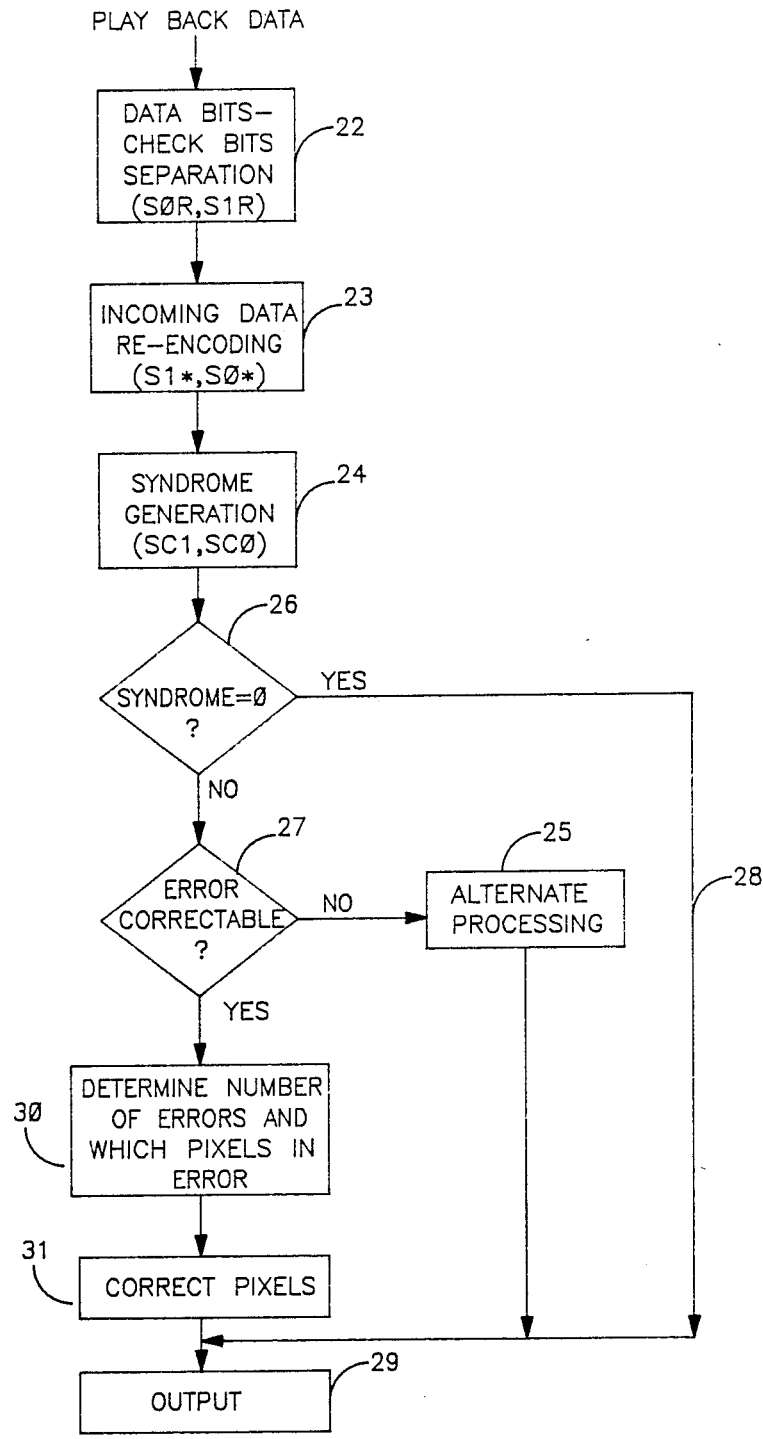

The invention, as well as the prior art, will be described with reference to the figures, of which:

FIG. 1 is a drawing illustrative of the scanning of an image as practiced in the prior art, FIGS. 2A and 2B are schematic representations of data blocks according to the invention, FIG. 3 is a flow diagram of steps in error correction of the data according to the invention.

Figure 10:
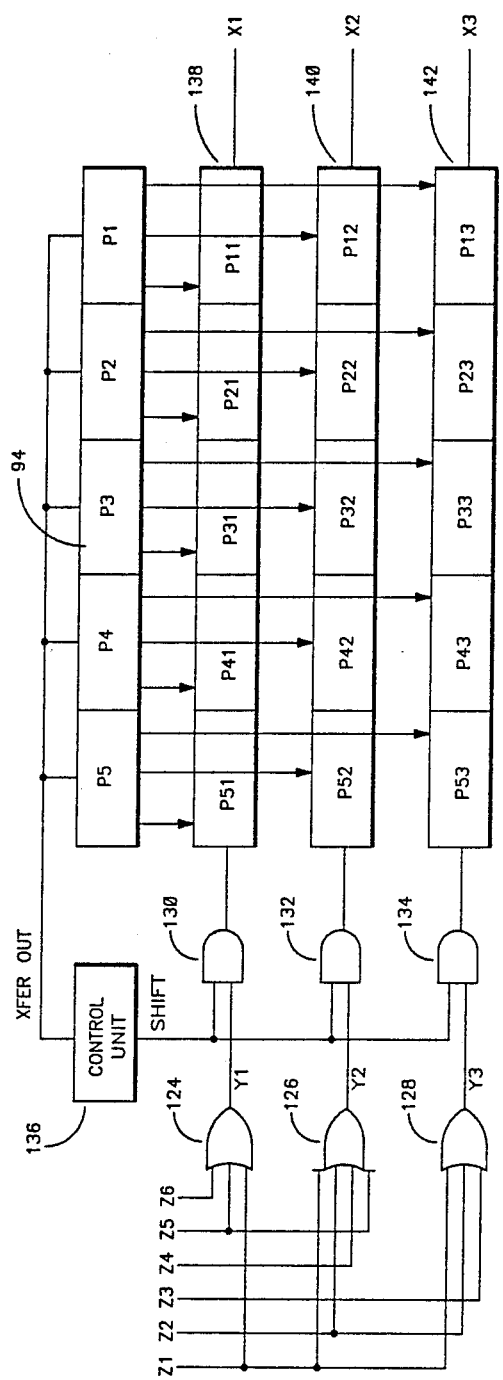
Figure 11:
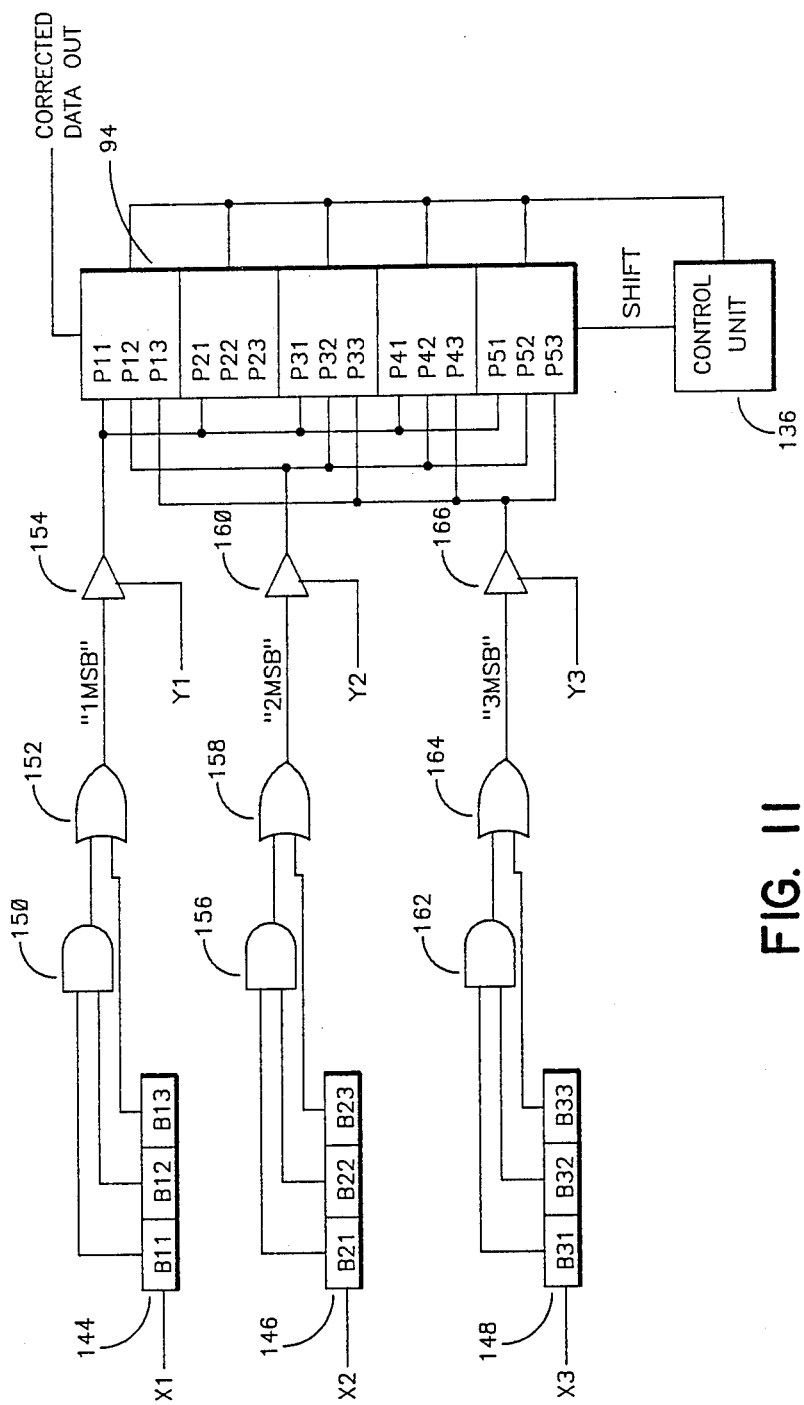
Figure 12:
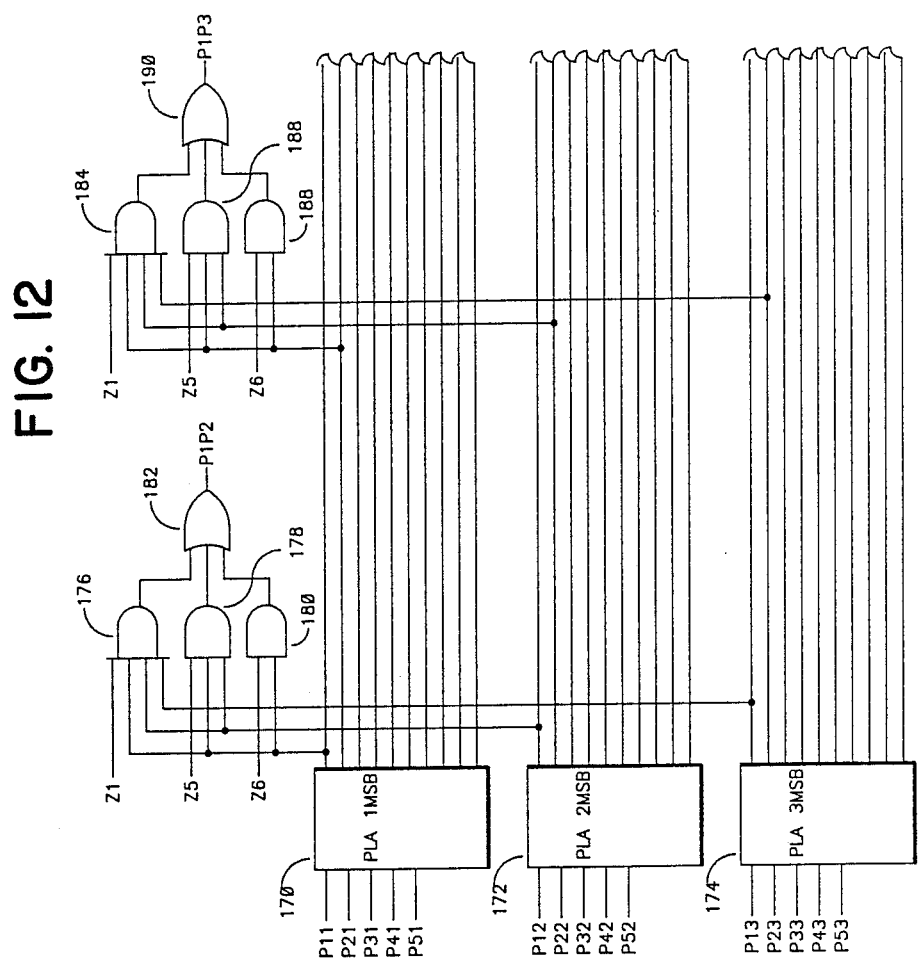
Figure 14:
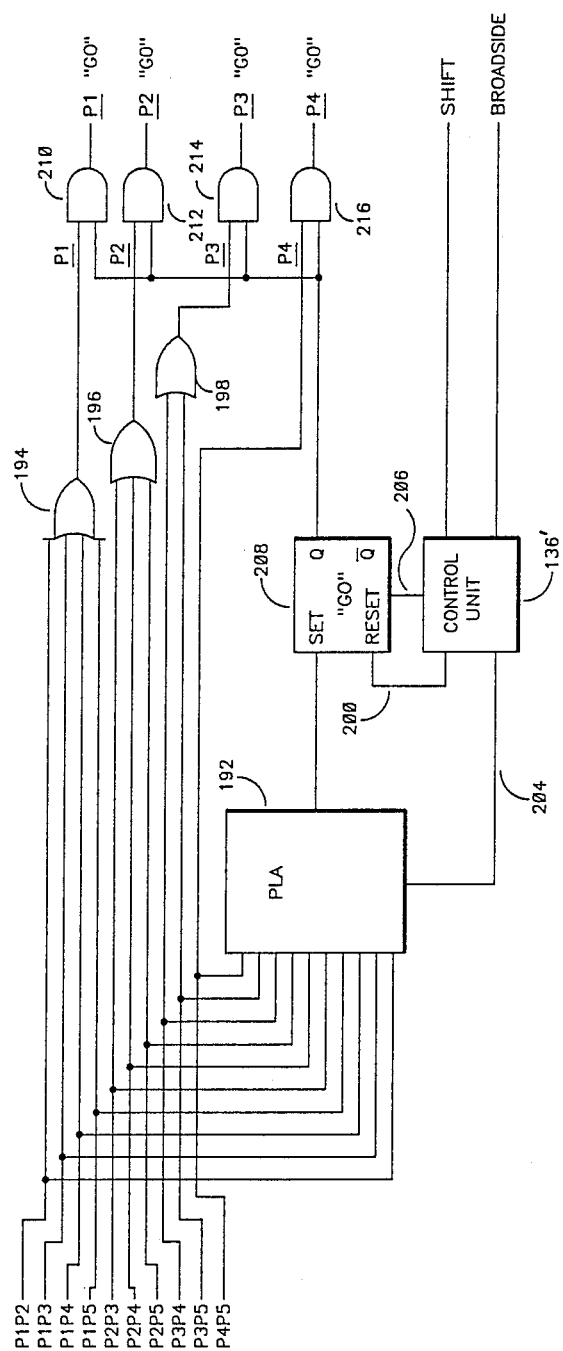
Figure 16:
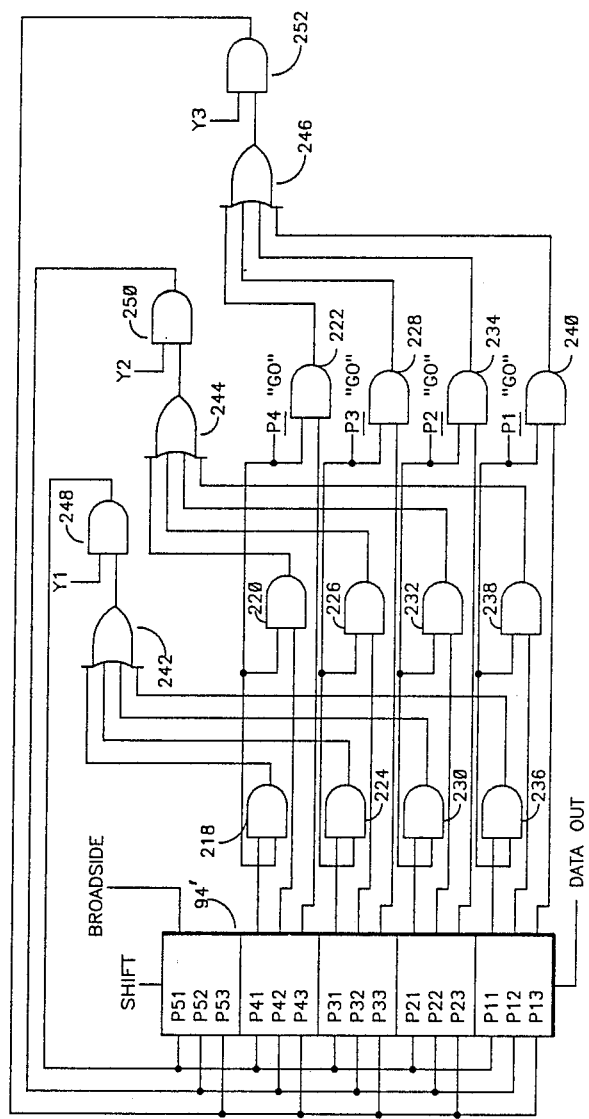

FIG. 4 is a drawing of a matrix of check bit relationships useful in understanding the practice of the invention, FIG. 5 is a modified version of FIG. 4 useful in further understanding the practice of the invention, FIGS. 6, 7, 8, 9, 10 and 11 are schematic circuit drawings of one embodiment of the invention, FIG. 13 illustrates the program structure of three programmed logic arrays utilized in a second embodiment of the invention, FIGS. 12, 14, and 16 are schematic circuit drawings of a second embodiment of the invention, and FIG. 15 illustrates the program structure of a fourth programmed logic array utilized in a second embodiment of the invention.

2. Description Relative to the Prior Art

While much digital data, such as that derived from computation and general data processing, has no redundancy, data generated by digital processing of images is characterized by substantial amounts of redundant information. The established method of converting images into digital data entails projecting the image onto a sensor having an analog output, and then scanning the sensor and digitizing its output. The redundancy inherent in the image is carried over into the resultant digital data stream, the digital values themselves exhibiting the redundancy of the original pictorial image.

Referring to FIG. 1, a scene 10 is scanned in horizontal segments by an optical scanning device 12 whose output is a raster 14 containing the pictorial information in the form of electrical analog signals. The scanning device 12 may be any one of the optical scanners known in the art; for example, the laser scanner, kinescope scanner, or CCD sensor and associated scanning circuits. The electrical signals are then sequentially digitized by means of a sampling analog to digital converter 16 whose output is the digital representation of the image intensity on a line by line basis. Such image samples are conventionally referred to as "pixels". Generally, the digitizer 16 outputs comprises the pixel value expressed in binary form wherein eight bits per sample correspond to a 256 level gray scale of image intensity. A digital eight bit sample is usually designated as a "byte"; however, a byte may be defined to contain any discrete number of bits. This binary coded representation of the digital values of the samples is called "pulse code modulation", or PCM. Usually the image is digitized to allow either electromagnetic transmission or magnetic recording of the PCM encoded samples.

Referring to FIG. 1, the line 18 represents a left-to-right scan across the "sky" portion 19 of the scene 10, and it will be appreciated that the image intensity across such a scan will be essentially constant. Similarly, the intensity of the scan of the line 20 across the sky remains essentially constant until the edge of the "cloud" 22 is encountered, and then the image intensity changes to another essentially constant value for the duration of the scan across the "cloud". Upon completion of the scan of the cloud, the intensity and the sample values then revert to the values representative of the "sky" 19. Such scans result in sample values that are highly redundant because there is little detail in the portions of the scene being sampled. On the other hand, the detailed portions of the scene which consist of rapidly changing intensities result in samples of limited redundancy; during the scan 23 across the "tree" 25, rapidly varying sample values of intensity are generated. Thus, the data is characterized by non-redundant bytes derived from scans of detailed portions of the image such as the "tree" 25, and by redundant byte values derived from scans of the "sky" 19 or the "cloud" 22 where the intensity changes little, if at all.

It is known in the art that redundancy in the image provides opportunities for the advantageous manipulation of the derived digital data. One useful data handling technique utilizes the redundancy to compress the data, and thereby to either reduce the bandwidth required for transmitting the data or to reduce the amount of storage necessary for storing it. An example of this technique may be found in U.S. Pat. No. 4,369,463 entitled "Gray Scale Image Data Compression with Code Words A Function of Image History" in the name of Anastassiou et al, issued Jan. 18, 1983. Such use of redundancy to effect data compression has been extensively exploited in the prior art.

In the present invention, attention is focussed on the use of image redundancy for purposes of error correction after the transmission or storage of the digitized image data. Aberrations such as fading in an electromagnetic transmission channel, or dropouts in a magnetic tape storage channel, cause signal loss and, upon recovery of the data, attendant errors. These errors result in easily discernible, detrimental streaking in the recovered image. The present invention ameliorates this problem by utilizing the available image redundancy as the basis for error correction in the recovered image data.

SUMMARY OF THE INVENTION

The invention teaches the grouping of the digitized bytes representative of an image into data blocks, whereby whatever redundant information present in the image becomes replicated in the data block and results in some of the bytes having essentially the same, or nearly the same, digital values as other bytes within the same block. Prior to transmission or storage, each block is analyzed for redundant sample values, i.e. values which are either identical or which only vary within predetermined boundaries, and check bits are accordingly affixed to the block. The configuration of the check bits defines the nature and the extent of the redundancy in the bytes comprising the block. The block containing data and check bits is then transmitted or stored. The recovered data, which has been subjected to induced errors during transmission or storage, is analyzed to ascertain whether the bytes comprising the block still contain the same redundancy specified by the affixed check bits. If an error has occurred the resultant redundancy of the received data will generally be reduced; at least one of the recovered pixels in the block will be different from what it originally was due to the error. The invention teaches re-encoding the received data to derive new check bits based on the received data which are then compared to the original check bits as received. This comparison generates a "syndrome" having the value "0" if the check bits derived from the received data are the same as the original check bits, and having the value "1" if the re-encoded check bits do not agree with the original check bits. A syndrome of value 1 flags an error and the fact that the data in the block has changed during transmission. In one embodiment of the invention, if an error has occurred, the received data bytes are then compared among themselves to ascertain which data pattern is characteristic of the majority of received bytes. This majority pattern is assumed to be the correct pattern for all the bytes of the block including the bytes in error. The bytes in error are then corrected in accordance with the instructions inherent in the configuration of the original check bits. The correction restores the data patterns to their original configuration, and, attendantly, restores the amount of redundancy that was originally present in the block.

It will be noted that the check bits are not derived from the actual values of the data bits as is characteristic of many codes known in the art. The check bits, according to the teaching of the invention, reflect the fact that "patterns" of data bits within the block are the same, but the check bits do not explicitly define the structure of these patterns.

For a block of n bytes, the number of bytes comprising a majority m is given by the expression $m=$(integer value of $(n/2)+1$, and, therefore, any of the remaining $n-m$ bytes in error may be corrected. For a block having n equals five, the majority m equals three, and the correctable bytes in error, $n-m$, equals two.

Before proceeding with an example illustrative of the practice of the invention, it is advantageous to provide a listing of various check bit symbols used in the description of the invention.

S0=check bit derived from data before transmission

S0R=received value of check bit S0 after transmission

S0*=re-encoded value of S0 derived from data as received after transmission

SC0=value of syndrome

A simple example utilizing only a single check bit illustrates the essential teaching of the invention. Referring to FIG. 2A, a series of bytes, a through f, assumed to be byte values derived from a picture, are shown along with their digital values. In encoding this example, three bytes comprise a block, and a check bit S0 is assigned to each block according to the following rules:

(i) if the three byte values are the same, S0=0

(ii) if the three byte values are not the same, S0=1.

Bytes a, b, and c all have the same binary value 11011001 and the redundancy of this block is a maximum. The check bit for block one is, therefore, S0=0. Bytes d, e and f have differing values, indicating no redundancy and the check bit for block two is S0=1.

It is now assumed that the transmission or storage process introduces an error in two bits of byte c of block one. The blocks as received are illustrated in FIG. 2B. Upon receipt, the data is re-encoded using rules (i) and (ii) and a re-encoded check bit S0* is generated. (In the specification and drawings, different but related elements are identified with the same reference characters, albeit that one element's reference character may be unprimed while that of its related element is primed; i.e. the byte, designated "byte a" before transmission is designated as "byte a'" as received after transmission.) Because byte c' is now different from bytes a' and b', the re-encoded check bit for block one is S0*=1. The recovered check bit accompanying the block, S0R, has the original value of S0, i.e., S0R=0.

The syndrome, SC0, is now derived by comparing S0* to S0R in an "exclusive or" circuit. If S0*=S0R i.e. the re-encoded check bit equals the original check bit, then the syndrome SC0=0, indicating the data values have not changed and that no error has occurred. If S0* differs from S0R, then SC0=1 and an error has occurred. In the present example, calculating the syndrome by comparing S0*=1 to S0R=0, results in SC0=1, and the error has been detected.

The bytes of block one of FIG. 2B are then compared among themselves to determine the byte configuration which is in the majority. In the present example, byte a' is found to be the same as byte b' and bytes a' and b' from the majority. Following the majority rule, the bits of byte c' are changed to agree with the corresponding bits of bytes a' and b' to effect the correction of the error of byte c'.

The invention also teaches protecting the integrity of the transmitted or recorded check bits by means of an interleaving technique. It will be appreciated that if the check bits and the data in a given block are both impaired due to aberrations of transmission or recording, then data correction is impossible. In electromagnetic transmission such aberrations may take the form of short noise bursts and in the case of magnetic recording of tape dropouts. To protect against these occurrences, the check bits of a given data block are separated from the data of their parent block, and are delayed or advanced and then interleaved with data of another block before transmission or recording. The check bits and the parent data from which they are derived are therefore separated in time; given check bits are timewise contiguous with data of some different block. A localized loss of signal, therefore, does not simultaneously affect a data block and its offspring check bits. Upon recovery, either the check bits or the data may be recoverable without the other being in error because of the interleaving, and after the data and check bits have been properly reassembled, error correction may be accomplished.

Incorporating the above basic inventive concept, more powerful and sophisticated codes have been derived which allow error detection and correction when the image has samples that provide less than the complete redundancy of this simple example. These codes generally employ more than a single check bit, and these additional check bits, following the notation system previously outlined, are symbolized as S1, S1*, S1R, SC1, etc. An embodiment of one such code is presented below.

It will also be appreciated that the majority rule described above for effecting error correction is a conservative one. Under certain circumstances it may be acceptable to employ a more liberal rule in performing the correction. In the embodiment of the invention previously described, wherein a block comprises five bytes, the majority rule requires that at least three bytes have identical bit patterns before error correction may be accomplished. This assures a high degree of reliability in the error correction. If, however, circumstances allow, it may be possible to relax this stringent requirement. For example, a block of five bytes having identical patterns prior to transmission, may, after transmission, exhibit identical patterns in only two of the five bytes. Under the majority rule no correction will be undertaken because only two and not three of the bytes have identical patterns. Under a more liberal rule, such as, . . . "error correction is performed if at least two of the received bytes have identical patterns", . . . then correction will be performed by forcing all the bytes to conform to the same pattern as the two identical bytes. It is clear that rules specifying from two bytes up to, or even more than, the majority value of [integer value of $(n/2)+1$ are increasingly conservative in effecting error correction.

DESCRIPTION OF THE INVENTION

Before providing a detailed description of an embodiment of the invention, it is first advantageous to consider the effect of single bit errors on an eight bit PCM word. The maximum range expressible by an eight bit word is 256, i.e. 0–255, and the maximum value is represented in binary as 11111111, with the conventional representation of the most significant bit (1 MSB) being to the left. A single bit error in the most significant bit results in the word 01111111 which is half of the full scale range. i.e. an error of 50%. Similarly an error in the second most significant bit changes the word value to 1011111, i.e. one quarter the full scale value, an error of 25%. The following table shows the error percentage of full scale for single bit errors in each of the eight bit positions.

| | |
|---|---|
| Most significant bit | 50% |
| Next most significant bit | 25 |
| 3rd most significant bit | 12.5 |
| 4th most significant bit | 6.25 |
| 5th most significant bit | 3.13 |
| 6th most significant bit | 1.56 |
| 7th most significant bit | 0.78 |
| Least significant bit | 0.39 |

If the first three most significant bits are in error, the total error in the word may be as great as 87.5% of full scale, while if the remaining bits are in error the total error will only amount to 12.5% of full scale. Assuming the probability of a bit error is independent of bit position in the PCM word, it is clear that chance errors in the higher order bits cause much more severe degradation of the image than errors affecting the lower order bits. Because the most significant bits are weighted so heavily in determining the digitized value of the image intensity, and because the redundancy resides in these higher order bits, the present embodiment of the invention concentrates on use of the image redundancy occurring in the three most significant bit positions for the correction of errors. This limits the complexity of the error correction implementation while providing protection against the most significant causes of image degradation.

In this embodiment of the invention, a two bit check pattern, S1, S0, is attached to each block of n pixels to provide an 8 n+2 bit block. Check bits are assigned in accordance with the following rules:

TABLE I

| S1 | S0 | CONDITION |
|---|---|---|
| 1 | 1 | Three most significant bits of |

TABLE I-continued

| S1 | S0 | CONDITION |
|---|---|---|
| | | all n pixels form identical patterns |
| 1 | 0 | Only the two most significant bits of all n pixels form identical patterns |
| 0 | 1 | Only the most significant bits of all n pixels are the same |
| 0 | 0 | None of the above |

It will be appreciated that the above assignment of check bits reflects the degree of redundancy in the three most significant bits of the pixel samples. For example, the check bits 1,1 indicate that the n pixels have the highest redundancy in their three most significant bits, i.e. the three most significant bit patterns for all n pixels are the same. On the other hand, the check bits 0,0 indicate that there is no redundancy among the most significant bits of the n pixels, i.e. all of the patterns are different. The intermediate cases of 1,0 and 0,1 reflect in-between conditions of redundancy.

After transmission or storage wherein the data is subjected to error effects due to transmission or storage aberrations, the data blocks are decoded and errors corrected in accordance with a decoding and error correcting algorithm. Referring to the flow chart of FIG. 3 which illustrates the decoding algorithm, separation of the data bits and the check bits is performed in the step represented by a rectangle 22. The recovered data is then re-encoded, again using the above stated encoding rule, (rectangle 23) and the resultant check bits S1*, S0* are combined with the received check bits S1R, S0R to generate the syndrome, SC1, SC0 of the received data block. This step is represented by rectangle 24, and consists of combining S1* with S1R and S0* with S0R by means of an "exclusive or" circuit. The resultant couple, SC1, SC0, has the possible values shown in the body of FIG. 4. It will be appreciated from inspection of the main diagonal of FIG. 4 that when both of the re-encoded check bits S1*, S0* agree with their corresponding received check bits S1R, S0R the syndrome SC1, SC0=0, 0. When the syndrome equals 0,0 (decision box 26), the n received bytes agree with the original n encoded bytes; no error occurred during transmission and no correction is required. The received data is passed through to the output 29 as indicated by the path 28 of FIG. 3.

If the syndrome is not equal to 0,0, the received data patterns are not in agreement with the original data pattern as encoded by the original check bits, and an error has been detected. Not all errors, however, are correctable, and the decision box 27 contains the steps to determine if, in fact, the detected error is correctable. First, it should be observed that the assignment of check bit values in Table I has been organized so that the greater the redundancy in the block, the higher the digital value embodied in the check bits S1, S0 considered as a binary word of the form S1S0. For example, the first entry in Table I, S1=1, S0=1, considered as a binary word S1S0 equals the binary value 11, and represents the highest redundancy condition to be encoded. With this in mind, an inspection of the borders of FIG. 4, i.e. S1R, S0R and S1*, S0*, shows that for all entries above the diagonal the received check bit redundancy as indicated by S1R, S0R is less than the corresponding re-encoded check bit redundancy indicated by S1*, S0*. For example, if the received check bits S1R, S0R=0, 1 while the re-encoded check bits S1*, S0*=1, 1 the received data, when re-encoded, exhibits greater redundancy than the redundancy of the original encoded data as indicated by the received original check bits S0R, S1R. The value of the resultant syndrome SC1, SC0=1, 0, therefore, is above the main diagonal of FIG. 4. While this syndrome value shows an error in transmission, it is apparent that the error is not correctable since there is no way of determining how the increased redundancy arose. For example, considering the extreme case where S1R, S0R=0, 0, i.e., the three most significant bits of all n bytes are different, but because of errors in transmission the data changes so that the re-encoded check bits S1*, S0*=1, 1. This indicates that the received data now shows a common pattern in the three most significant bits for all n bytes of the block. It is clear that the original data is not recoverable. This condition applies to all syndrome values above the main diagonal of FIG. 4, and all such data is not correctable, and as such is passed to the output 29 of FIG. 3 for possible alternative error correction processing, 25.

Those data blocks whose syndromes, however, fall below the main diagonal of FIG. 4 are those which, after re-encoding, show less redundancy than that indicated by the received check bits S1R and S0R. For example, if S1R, S0R=1, 0, i.e. the two most significant bits of the original data were the same for all bytes, and the re-encoded check bits S1*, S0*=0, 1, i.e. the most significant bits of all bytes are the same, then it is clear that the second most significant bit of the received data can be corrected by making it equal to the second most significant bit that is in the majority among the bytes. This will restore the original redundancy, i.e. S1*, S0* would now be equal to 1,0. A similar analysis for all entries resulting in syndromes which fall below the main diagonal of FIG. 4 also lead to the same conclusion.

Upon determination that the errors are correctable, the bytes which are in error and the magnitudes of the errors are ascertained (rectangle 30). The entries of FIG. 4 that appear below the main diagonal are repeated in FIG. 5. Additionally, entry values specifying the bit positions requiring correction are stated for each syndrome value. (The syndrome values are enclosed in parentheses.) For example, if S1*, S0*=0, 0 and the syndrome SC1, SC0=1, 0 then the most significant bit and the second most significant bit are correctable. The most significant bit is represented as 1MSB, the second most significant bit as 2MSB, and the third most significant bit as 3MSB. These entries are derived by comparison of the redundancy called for by the original check bits, the redundancy specified by the re-encoded check bits, and the necessary steps required to restore the original redundancy to the received data as explained above. Because the syndrome values of FIG. 5 are not unique, it is necessary to differentiate between identical values appearing in the table; specifying the value of S1*, S0* along with the syndrome value performs this differentiation.

The next step of the correction process, as specified by the rectangle 31 of FIG. 3, is determination of the majority pattern among the bit positions to be corrected. The majority is determined by counting the 1's and 0's in a given bit position of all the bytes in the block and ascertaining which count is greater; the symbol with the greater count is in the majority. After the majority pattern is determined, which in the present embodiment provides the exemplar bit pattern, all bytes requiring correction are accordingly modified to agree with the ascertained majority.

A detailed example of circuits useful in understanding the above embodiment of the invention will now be presented. In this example, blocks of five bytes are assumed. This provides an adequate number of bytes per block to exhibit sufficient redundancy for encoding without over complicating the implementation. The description also assumes the PCM signals are synchronized by means of conventional synchronization techniques well known in the art. The digital circuits employed in this implementation employ positive logic; e.g. a "low" signal equals a voltage, say, of 0 volts and a "high" signal equals a positive voltage. A "0" signal may therefore be 0 volts, and a "1" signal some convenient positive voltage. As is conventional in the art, the "set" output of a flip-flop is labelled as the "Q" output, and the "reset" output is labelled as the "Not Q" output.

Figure 6:
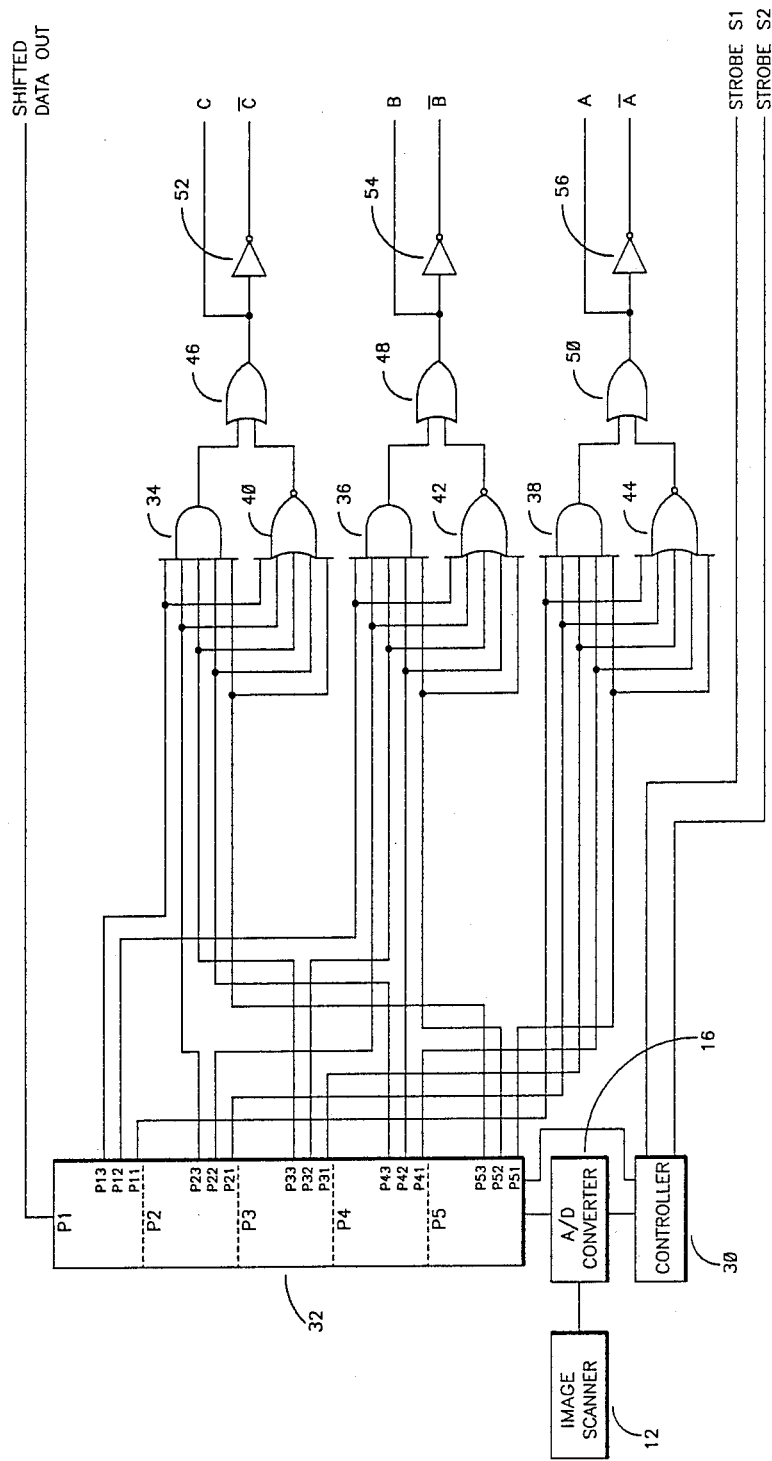

Referring to FIG. 6, the method of encoding the blocks will first be described. The analog output of the image scanner 12 is digitized by the analog-to-digital converter 16 under command of a controller 30. The resultant PCM data stream is fed to a forty position shift register 32 capable of holding five eight bit bytes. The shift register is comprised of eight bit universal shift register elements, such as the Texas Instruments Type SN74S299 register, which is capable of both serial bit shifting and parallel input/output operations. After five bytes have been fed to the shift register 32, the controller 30 stops the analog to digital converter 16 and the encoding process is initiated. The five bytes are contiguously located in the shift register 32, and the three highest bit positions for each byte are available as parallel outputs from the shift register 32. These outputs are labelled P51, P52, P53, etc. where P51 means the most significant bit position of byte five, P52 means the second most significant bit position of byte five, P53 means the third most significant position bit of byte five, and similarly for the corresponding bit positions of bytes four, three, two and one. The three most sigificant bit outputs of the five bytes are connected to "And" gates 34, 36, 38 and "Nor" gates 40, 42, 44 in the following manner. The most significant bits P51, P41, P31, P21, P11 of the five bytes are connected as inputs to the "And" gate 38, and also as the inputs of the "Nor" gate 44. Correspondingly the second most significant bits are connected to the "And" gate 36 and the "Nor" gate 42, while the third most significant bits are connected to the "And" gate 34 and the "Nor" gate 40. The outputs of the "And" gate 38 and its associated "Nor" gate 44 serve as inputs to an "Or" gate 50. When the inputs to the "And" gate 38 are all high, the output of the gate 38 is high, and when the inputs to "Nor" gate 44 are all low the output of the gate 44 is high. Therefore the output of the "Or" gate 50 is high when all the most sigificant bits of all five bytes agree, i.e. they are either all zeros or all ones. Similar connections from the "And" gate 36 and the "Nor" gate 42 combination, and the "And" gate 34 and the "Nor" gate 40 combinations to the "Or" gates 48, 46 provide similar signals when the second most significant bits agree, and when the third most significant bits agree. The output of the gate 50, designated "A" also feeds an inverting amplifier 56 whose output is designated "Not A". The outputs of the gates 48 and 46 are designated as "B" and "C" and their inverted signal values, derived from the inverting amplifiers 54, 52, are designated as "Not B" and "Not C".

Figure 7:
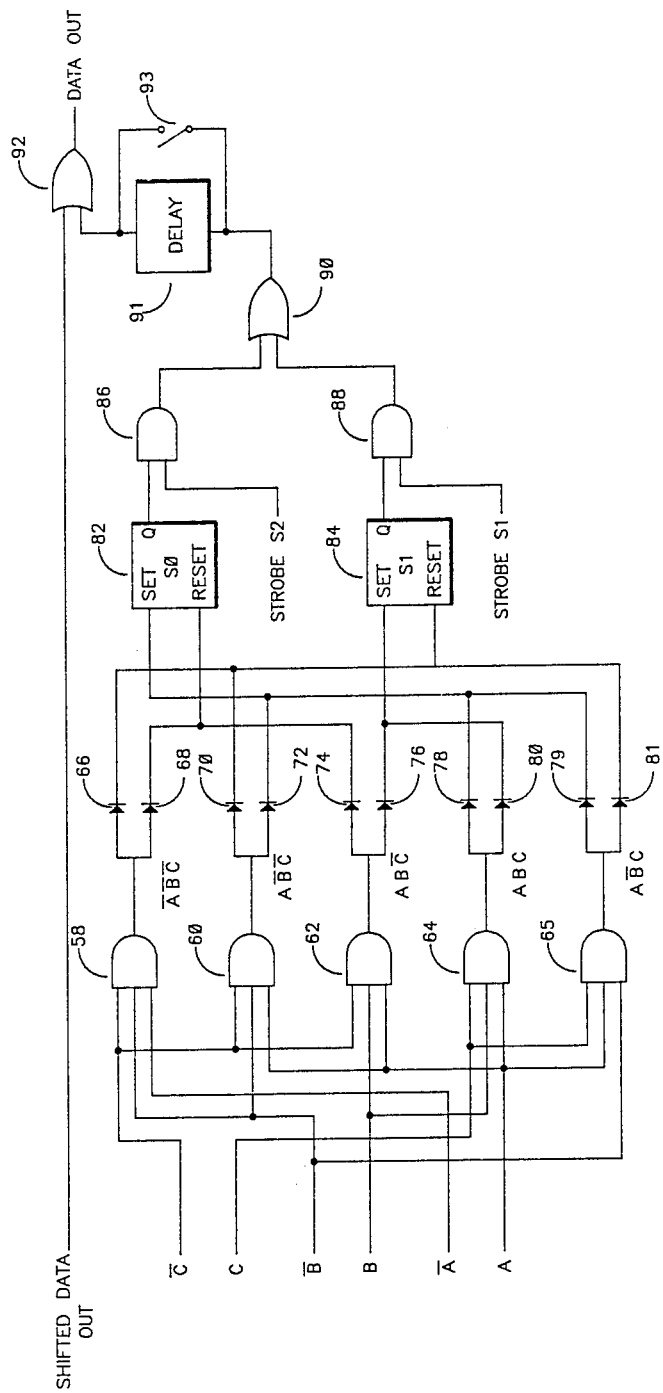

Referring to FIG. 7, the signals A, B, C and their complementary signals Not A, Not B, Not C, are applied to "And" gates 58, 60, 62, 64 and 65 to generate the logical signals which determine the check bits in accordance with the rules of Table I. For example, the inputs to the "And" gate 60 are A and Not B and Not C. This is the condition whereby the most sigificant bits of all 5 bytes are the same, while the second most significant bits differ among themselves, as do the third most significant bits. Referring to the check bit rules of Table I, the preceding condition results in the check bit S1=0 and the checkbit S0=1. When the inputs to the "And" gate 60 and A and Not B and Not C (i.e. when these signals are positive), the output of gate 60 is positive. The check bits themselves are obtained by setting the S1 flip-flop 84 and the S1 flip-flop 82 in accordance with the rules. In this example, when the output 60 becomes high this signal is applied through a diode 70 to reset the S1 flip-flop 84, i.e., Not Q, and through a diode 72 to set the S0 flip-flop 82, i.e., S1 is set equal to 0 and S0 is set equal to 1. The signal A and C and Not B also sets the check bit flip-flops, 82 and 84, to the same aforesaid condition by means of diodes 79, 81. This is required because if B is not true, only the pattern of the most significant bit is encoded regardless of the state of C.

When the other conditions listed in Table I are applicable, the appropriate "And" gate, either 58, 62 or 64 becomes high and the gate output is applied through the associated diodes 66, 68, or 74, 76, or 78, 80 to appropriately set the S1 flip-flop 84 and the S0 flop-flop 82 to their required states. The Q outputs of flip-flops 82 and 84 reflect the state of the flip-flops, and these outputs are respectively connected to inputs of "And" gates 86 and 88. After the flip-flops 82 and 84 have been set, the controller 30 (FIG. 6) sequentially emits strobe signals "Strobe S1" and "Strobe S2" which sample the states of the S1 and S0 flip-flops 84, 82. The outputs of gates 86 and 88 feed the inputs of an "Or" gate 90 whose output is the check bits. Assuming switch 93 is closed, this output feeds one input of an "Or" gate 92 whose other input is the data bits from the shift register 32. After the check bits have been generated, the controller 30 shifts the data bits out of the shift register 32 into the other input of the gate 92. The output of the gate 92 is a data stream comprised of the merged check bits and data which is suitable for transmission or recording.

Figure 8:
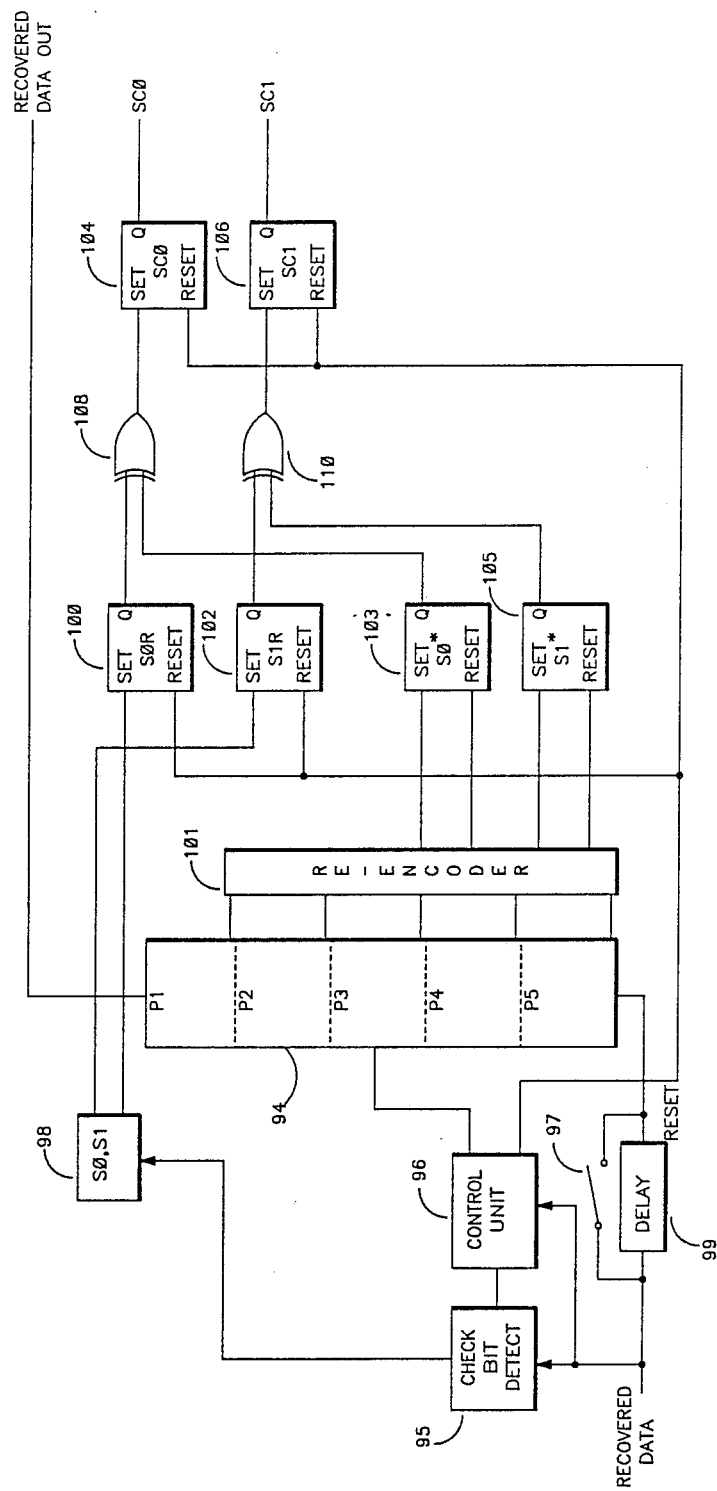

The processing of the received PCM signal stream will now be explained, and the circuits for error detection and correction described. Referring to FIG. 8, the received data is fed to the input of a check bit detector 95, the control unit 96, and assuming the switch 97 is closed, directly to the input of a 40 bit shift register 94. The shift register 94 is essentially the same type as the shift register 32 previously described. As earlier stated, the synchronization of the PCM data is performed by conventional techniques known in the art, and assuming synchronization, the controller signals to the shift register 94 when the forty bits corresponding to five bytes have been loaded in the shift register 94. The check bit detector 95 then passes the next two bits, which are the received check bits S1 and S0, to a two bit shift register 98. When the block comprising the five data samples and the two check bits have been shifted into the shift registers 94, 98, the control unit 96 resets a S0R flip-flop 100, a S1R flip-flop 102, a SC0 flip-flop 104 and a SC1 flip-flop 106, and activates a re-encoder circuit 101. The re-encoder 101 is comprised of the identical combination of encoding gates connected as shown in FIGS. 5 and 6. It includes the equivalents of all the gates 34 through 64 of FIGS. 5 and 6, and the diodes 66 through 80 of FIG. 6. The diodes in the re-encoder 98 are connected to the flip-flop 100 which is the S0* flip-flop, and to the flip-flop 102 wich is the S1* flip-flop, in the same manner as the connections to the S0 flip-flop 82 and the S1 flip-flop 84 on the encoding side. The control unit 96 also transfers the recovered S0 and S1 check bits in parallel out of the shift register 98, and sets the S0R flip-flop 100 if S0R=1 and sets the S1R flip-flop 102 if S1R=1. The value of S0R is compared to S0* by feeding these two signals as the inputs to an "Exclusive Or" circuit 108. If S0R=S0*, the output of the gate 108 is high, otherwise it is low. If the output of the gate 108 is high then the S0 syndrome flip-flop 104 is set, otherwise the output of flip-flop 104 remains low. Similarly the S1* output of flip-flop 105 is compared to the S1R output of the flip-flop 102 and if they are equal then the syndrome flip-flop SC1, 106, is set high by the high output of the gate 110.

Figure 9:
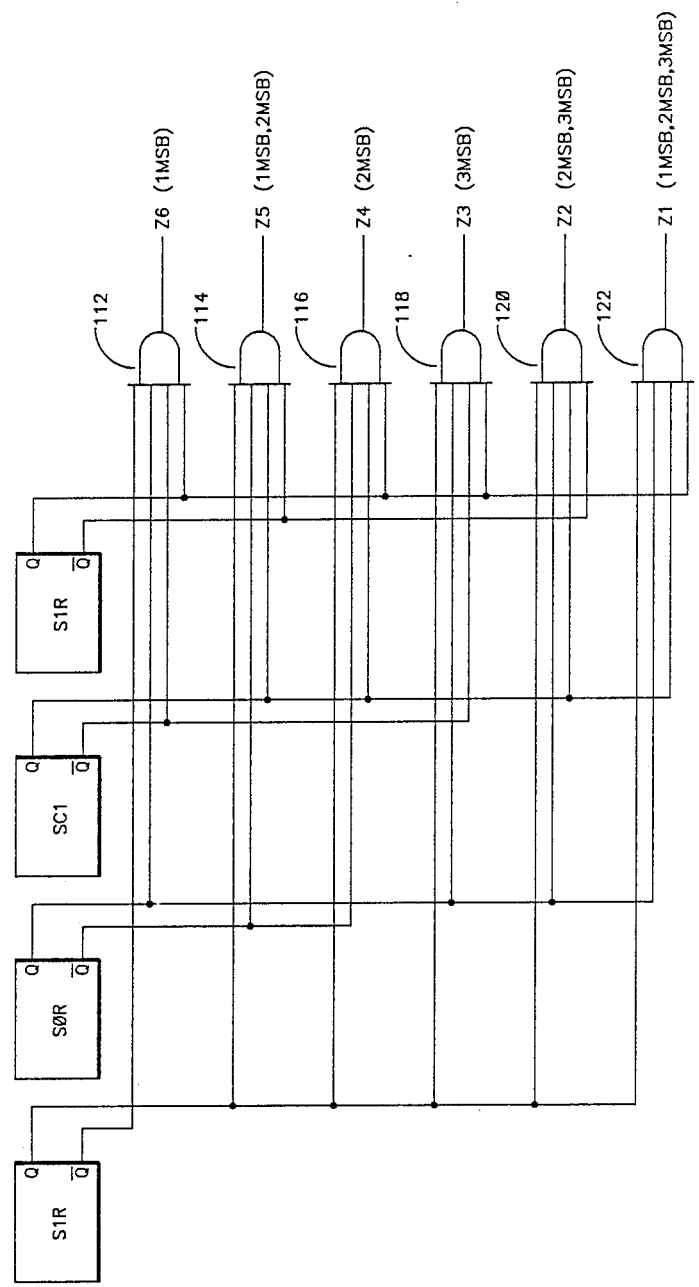

As previously explained, FIG. 5 illustrates the combinations of S1*, S0*, S1R, S0R, and SC1, SC0 corresponding to correctable errors, i.e., entries below the main diagonal of FIG. 4. Any two sets of the parameters S1*, S0* or S1R, S0R or SC1, SC0 may be used to define the correctable errors. In FIG. 9, the conditions of FIG. 5 are implemented using the outputs of S1R, S0R, SC1 and SC0 applied to a series of "And" gates 112, 114, 116, 118, 120, and 122. The outputs of the gates 112 through 122 ... Z1, Z2, Z3, Z4, Z5, Z6 ... are the six entries in the matrix of FIG. 5. For example, the inputs to the gate 120, are the Q output of S1R, the Q output of S0R, the Q output of SC1 and the not Q output of SC0. If S1R=1, S0R=1, SC1=1 and SC0=0 then the output of the gate 120, i.e. Z2, will be high indicating that 2MSB and 3MSB require corection. The other entries of FIG. 4 are similarly implemented by the gates of FIG. 9 and the bit positions of the three most significant bits to be corrected are indicated in parentheses after the gate output designations, Z1 through Z6. Considering the entries in the parentheses, it will be appreciated that when 1MSB is to be corrected either Z6 or Z5 or Z1 will be high. When 2MSB is to be corrected either Z5 or Z4 or Z2 or Z1 will be high. When 3MSB is to be corrected either Z3 or Z2 or Z1 will be high. Referring to FIG. 10, Z1 through Z6 are applied as inputs to "Or" gates 124, 126, 128 in accordance with the above stated conditions. The output of the gate 124, Y1 is high whenever 1MSB is to be corrected, the output of the gate 126, Y2 is high whenever 2MSB is to be corrected, and the output of the gate 128 is high whenever 3MSB is to be corrected. Any or all of these gates may be high. The outputs Y1, Y2, Y3, respectively feed the inputs of "And" gates 130, 132, 134 whose second inputs are a shift signal from a control unit 136. The three most significant bit positions of the shift register 94, (which are also connected to the re-encoder 101 of FIG. 7,) are connected to three five bit shift registers 138, 140, 142 in the following manner. The five most significant bit positions (1MSB) of the bytes in the shift register 94 are connected to the parallel input ports of the shift register 138. Similarly, the second most significant bit positions (2MSB) are connected to the shift register 140 and the third most significant bit positions (3MSB) to the shift register 142. The control unit 136 first emits a transfer command which "broadsides" the three most significant bits of all five bytes from the shift register 94 into their positions in the registers 138, 140, 142. The control unit 136 then emits five shift pulses which are applied as the second input to the gates 130, 132, 134. If the most significant bit is to be corrected, signal Y1 will be high and the gated shift pulses will appear at the output of the gate 130 and will shift the five stored values of the most significant bits out of the shift register 138. This shifted output appears as an output signal X1. Similarly if the second or third most significant bits are to be corrected, signals Y2 or Y3 will be high and the appropriate bits will be shifted out of register 140 or 142. If a certain bit position is not to be corrected, then the corresponding Y designated output will be low, and no shift pulses will appear at the output of the gate 130, 132 or 134 corresponding to that bit position.

Referring to FIG. 11, the output, X1, from the shift register 138 is connected to the input of a three bit binary counter 144, and similarly the outputs X2 from the shift register 140, and X3 from the shift register 142 are connected to the respective inputs of three bit binary counters 146 and 148. The counters 144, 146, 148 determine the majority configuration of the "0" and "1" values in the most significant bit position, the second most significant bit position and the third most significant bit position of the five bytes respectively in the following manner. Considering the counter 144 which advances a count each time a "1" in the most significant bit position is input, the count progression is:

000=0

001=1

010=2

011=3

100=4

101=5

Recalling that agreement among three elements out of five constitute a majority, it will be realized from the foregoing listing that if the highest order in the counter is a "1" or if the two lower orders in the counter are both "1" then the "1"'s are in the majority, since these conditions result from counts of three, four or five inputs to the counter; otherwise after five counts the "0"'s are in the majority. This algorithm is implemented by connecting the two low order bit positions of the counter 144 to an "And" gate 150 whose output is connected to one input of an "Or" gate, the other input of which is connected to the high order position of the counter 144. The output of the gate 152 is therefor a "0" if the majority of the most significant bits of the sample are "0"'s and is a "1" if the majority are "1"'s. The output of the gate 152 serves as input to a gated amplifier 154, which is turned "on" by the signal Y1 indicating that the most significant bit is to be set at the value appearing at the output of the gate 152. The output of the amplifier 154 is strapped to all the parallel input positions of the most significant bits of the shift register 94, and upon command from the control unit 136 the majority value of the most significant bit is "broadsided" into the shift register 94. The equivalent operations are simultaneously performed on the second most significant bits and the third most significant bits if the Y2 and Y3 signals are high through the gates 156, 158 or 162 164 and the gated amplifiers 160, 166. If the Y2 signal is high the second most significant bit value present at the output of the amplifier 160 is "broadsided" into the shift register 94, and if the Y3 signal is high the output of the amplifier 166 is also transferred into the shift register. The corrected information is then serially shifted out of the register 94 under control of the shift pulses from the control unit 136.

The above described embodiment of the invention incorporates the majority rule in effecting error correction. As previously stated, a less stringent rule provides error correction when only two of the five pixels are identical. In an embodiment utilizing such a rule the description of the invention is the same as provided above for the operations described in FIGS. 3 through 9. In FIG. 10 the circuits for generating the signals Y1, Y2, Y3 are still required in the embodiment of the "two out of five" rule, however the remaining circuits of FIGS. 10 and 11 are replaced by the circuits of FIGS. 12, 14 and 16.

Referring to FIG. 12, the inputs of three programmed logic arrays (PLA) 170, 172, 174 are connected to the parallel output ports of the shift register 94 of FIG. 8 which contain the three most significant bits of the five pixels. The five most significant bits (1MSB) are input to the PLA 170, the second most significant bits (2MSB) are input to the PLA 172, and the third most significant bits (3MSB) are input to the PLA 174. Each PLA is programmed to test the equality of each possible set of inputs taken two at a time from the five pixel inputs; this results in ten test results which become the outputs of the PLA's. The programming is identical for the three PLA's, and is represented by the matrix of FIG. 13. Assuming j=1, i.e. the PLA 170 employing the most significant bit information is under consideration, FIG. 13 defines the outputs for all pairs of inputs for the PLA 170. For example, the matrix indicates that output four is positive when all possible pairs are unequal except the pair consisting of P11 and P51 which are equal, i.e. they are both either 0 or 1. Each output of FIG. 13 represents a similar requirement on two of the most significant bit values of the five pixels. When j=2 the matrix applies to the PLA 172 and when j=3 the matrix applies to the PLA 174.

Keeping in mind that in FIG. 12 the ten output lines of each of the PLA's 170, 172, 174 contain information of the equality of pairs of each of the three most significant bit positions respectively, the circuit consisting of "And" gates 176, 178, 180 and "Or" gate 182 provides the information on equality of patterns when either one, or two, or three of the three most significant bit (1MSB, 2MSB, 3MSB) positions are considered. FIG. 13 indicates that output line (1) from each of the PLA's 170, 172, 174 carries the information concerning the equality of the pair pixel one and pixel two. These three output lines are connected as inputs to the gate 176, and the Z1 signal, (See FIG. 9) which indicates that the three most significant bits are to be corrected is also applied as an enabling pulse. Therefore, if the pattern of the three most significant bits of pixels one and two are identical the output of the gate 176 will be positive. If only the pattern of the two most significant bits are under consideration, the number (1) output lines of the PLA's 170 and 172 are fed to an "And" gate 178 and the Z5 signal which is active when the two most significant bits are to be corrected is also applied. Therefore, when the patterns of the two most significant bits of pixels one and two are identical, the output of the gate 178 is positive.

Similarly, the output of a gate 180 is positive when only the most significant bit itself is correspondingly under consideration. The outputs of the gates 176, 178, and 180 are inputs to an "Or" gate 182 whose output is positive under the conditions specified by signals Z1, Z5, or Z6 and when the pixel one pattern is identical to the pixel two pattern. This output is designated P1P2. Similarly, nine more equivalent circuits are used to correspondingly synthesize the pairs of signals from all the outputs listed in FIG. 13. For example, the gates 184, 186, 188 and 190 combine the information appearing on output lines two of the PLA's 170, 172, 174 to provide the signal designated P1P3. Additional the identically configured gates connected to the remaining output lines of the PLA's 170, 172, 174 generate the signals P1P4, P1P5, P2P3, P2P4, P2P5, P3P4, P3P5, P4P5.

Referring to FIG. 14, these ten signals serve as inputs to a PLA 192 whose single output initiates the correction cycle if required conditions are met. These conditions are programmed into the PLA 192 and are shown in the matrix of FIG. 15. While the basic rule of the present embodiment is to perform correction with an agreement of two out of five pixels, it is necessary to make provision for processing the pixels when there is greater agreement than this minimal amount. Each row of FIG. 15 represents a possible condition existing among the ten inputs. Condition one applies if the patterns of the associated bit patterns of all five pixels are identical i.e. there is no error in the block. The correction cycle is initiated but no correction per se is performed; the data is shifted out with no changes. Conditions two through six apply when one out the five pixels differs from the others; these entries spell out the conditions resulting from each of the possible pixels being different from the remaining four. Conditions seven through sixteen arise when any two of the pixels are different from the three remaining ones; there are ten entries since there are ten ways of selecting two pixels from a collection of five pixels. Conditions seventeen through twenty six apply when any three pixels differ from the remaining two; this is the rule of "two out of five" of the presently described embodiment. The "N" entry in this section of the matrix signifies that if the specific event corresponding to an "N" occurs, then error correction is not initiated even though the condition resulting in a "1" entry also obtains. For example, if pixel four agrees with pixel five then the condition for error correction would appear to hold since the last entry of the row specifying condition seventeen is met. Under the simultaneous circumstance that the three remaining pixels, i.e., pixel one, pixel two and pixel three, differ among themselves as well as differing from pixels four and five error correction proceeds. However, if any two of pixel one, pixel two and pixel three agree and also are different from pixels four and five, then the "N" condition holds and error correction is not allowed. It will be appreciated that under these circumstances there are simultaneously two sets of two pixels each wherein the pixels in each set are mutually in agreement but where the sets themselves differ from one another, and accordingly it is impossible to determine which of the sets should be used in effecting correction.

Referring again to FIG. 14, the signals P1P2 through P4P5 also are grouped into inputs for "Or" gates 194, 196, 198. The inputs P1P2, P1P3, P1P4, P1P5, i.e. those signals which have as one component the pixel P1 in agreement with some other pixel, feed the "Or" gate 194. Similarly, those related to P2 feed the "Or" gate 196, while those of P3 feed the "Or" gate 198; P4 is carried straight through because there is only one signal incorporating the pixel P4. It will be appreciated that it is unnecessary to generate a P5 signal because the P1 through P4 signals are derived from all possible combinations of two pixels out of five which are in agreement. Therefore, the cases where pixel five are in agreement with a second pixel are already included in the signals P1 through P4. The control unit 136' emits a signal via a connection 200 to reset a flip-flop 208. The control unit 136' then interrogates the PLA 192 via a connection 204 and if the output line of the PLA 192 is high, the flip-flop 208 is set. The Q output of the flip-flop 208, labelled "Go" is input to "And" gates 210, 212, 214, and 216 whose other inputs are the outputs from the "Or" gates 194, 196 and 198. The output of the gate 210, P1 "Go", is active if error correction is to be made and pixel one is one of the two pixels in agreement as required by the rule of the embodiment; this means pixel one will be used as the exemplar to which the other pixels will be forced to conform. The output of the gate 212 is a corresponding output for pixel two, as are the gates 214 and 216 for pixels three and four.

The correction of the pixels in error may be understood by reference to FIG. 16. (Because only the three most significant bits of the five pixels are involved in the error correction, these bit positions are labelled in the shift register 94'. It is, however, to be understood that the other bits of the five pixels are appropriately positioned in the shift register 94' and will sequentially shift out of the register in their proper positions.) The parallel outputs of the shift register 94' are connected to one input of a series of "And" gates, 218, 220, 222, 224, 226, 228, 230, 232, 234, 236, 238, and 240. The other input to these gates are the P1 "Go", P2 "Go", P3 "Go" and P4 "Go" signals which enable the transfer of the correcting pixel to the pixels locations in the shift register 94' being corrected as follows. For example, assuming that pixel three is to be used as the exemplar to which the pixels in error will be forced to conform, and that the most significant bit and the second most significant bits are to be corrected. The first condition results in the P3 "Go" signal being high enabling the transfer of the bits of pixel three. The gate 224 will be high if P31 is a "1" or it will be low if P31 is a "0". Similarly, the gate 226 will transfer the value of P32 and the gate 228 will transfer the value of the P33. The outputs of the gates 218, 224, 230 and 236 which are gated values of the most significant bits of the five pixels feed "Or" gate 242. The gates 220, 226, 232, 238 similarly feed the five second most significant bits to "Or" gate 244, while the gates 222, 228, 234, and 240 feed the third most significant bits to "Or" gate 246. It will be appreciated that only one of each of the four inputs to the gates 242, 244, 246 will be active at one time, because only one of the four P1 "Go", P2 "Go", P3 "Go" or P4 "Go" signals are active at any given time. The second condition stated above that the most significant bit and the second most significant bit are to be corrected means that the Y1 and Y2 signals are high. The Y1 signal is applied to one input of "And" gate 248 and the output of the gate 242 is applied to the other input of gate 248. When Y1 is high the output of the gate 242 is passed to the strapped inputs of all the most significant positions of the shift register 94'. Again considering the case when P3 "Go" is high, and Y1 and Y2 are also high the most significant bit of pixel three will be transferred via the gate 242 and gate 241 to the parallel input position of the most significant bit for all five pixels of the shift register 94'. Similarly, the second most significant bit will be transferred to the parallel input positions of the shift register 94'. These bits will be "broadsided" into the five pixel positions of the shift register 94' under control of the control unit 136' and all pixels will conform to the two most significant bit positions of pixel three. When signal Y3 is high the third most significant bits will also transfer in a corresponding manner. After the correcting pixels are "broadsided" into the shift register 94', the control unit 136' will emit shift pulses to the shift register 94' and the data will be serially read out.

The previously described interleaving of the data and check bits may be understood by again referring to FIG. 7. If the switch 93 is open, the output of the gate 90 feeds a fixed delay 91. This delay effects the interleaving by timewise shifting the check bits relative to the data before the check bits are merged with the data stream output from the shift register 32 of FIG. 1. As previously explained, this provides protection that a data block and its associated check bits are not simultaneously impacted by an error producing aberration. On the data recovery side, FIG. 8 illustrates the method for re-assembling the recovered check bits with the parent data block. Assuming the switch 97 is open, the input data is applied both to the input of a delay 99 and to check bit detector 95. The delay 99 is of the same fixed delay value as the delay 91, and in this case the data is timewise delayed and the parent data block is brought back into the proper relationship with the offspring check bits which traverse the undelayed path through the check bit detector 95 into the S0, S1 shift register 98.

The invention has been described in detail with particular reference to preferred embodiments thereof, but it will be understood that variations and modifications can be effected within the spirit and scope of the invention. For example, another embodiment of the invention incorporates a software programmed microprocessor performing the operations carried out by the hardware implementation of the present description. Also, while the practice of the invention has been described in detail for blocks comprised of five samples, it will be appreciated that blocks of other lengths may readily be employed in the practice of the invention.

What is claimed is:

1. Apparatus adapted for error correction of digital data characterized by redundant information associated therewith, said apparatus comprising:
   (a) means for assembling said digital data into bytes comprised of a discrete number of bits,
   (b) means for aggregating said bytes into blocks of a predetermined number of bytes per block to comprise a first group of blocks,
   (c) means for determining the amount of said redundant information associated with the bytes of a block of said first group of blocks,
   (d) means for encoding said amount of redundant information to provide an encoded redundancy signal for said block,
   (e) means for merging said encoded redundancy signal with said block to provide a composite assemblage of said encoded redundancy signal and said bytes,
   (f) means for recovering bytes from said composite assemblage to provide recovered bytes,
   (g) means for recovering an encoded redundancy signal associated with said recovered bytes from said composite assemblage, to provide a recovered redundancy signal,
   (h) means for organizing said recovered bytes and said recovered redundancy signals into recovered blocks to comprise a second group of blocks, whereby said recovered blocks are comprised of said recovered bytes and recovered redundancy signals essentially in correspondence with said bytes and said redundancy signals comprising said first group of blocks,
   (i) means for determining amount of redundant information associated with said recovered bytes of a recovered block,
   (j) means for representing said amount of redundant information in said recovered bytes as a re-encoded redundancy signal,
   (k) means for comparing said recovered encoded redundancy signal with said re-encoded redundancy signal, whereby correctable errors in said recovered bytes are detected, and
   (l) means for utilizing said amount of redundant information in said recovered bytes of said recovered block for correction of said correctable errors in said recovered bytes of said recovered block.

2. The apparatus of claim 1 wherein said means for determining the amount of redundant information in said bytes of said block is means for ascertaining structural bit patterns among said bytes in said block, whereby the greater the conformity of the structural bit patterns among said bytes of said block, the greater the amount of redundant information associated with said bytes.

3. The apparatus of claim 2 wherein said means for ascertaining structural bit patterns among said bytes is means for byte-by-byte, bit-by-bit, comparison of at least the three most significant bits of said bytes in said block of said first group of blocks.

4. The apparatus of claim 1 wherein said means for encoding said amount of redundant information is means for providing at least one check bit associated with said block of said first group of blocks.

5. The apparatus of claim 4 wherein said means for encoding said amount of redundant information is means for providing two check bits associated with said block of said first group of blocks, said apparatus further comprising:
   (a) means for assigning first of said check bits a first binary value and second of said check bits said first binary value, if the bit patterns of the three most significant bits of each byte of said block are identical.
   (b) means for assigning first of said check bits said first binary value and second of said check bits a second binary value, if only the bit patterns of the two most significant bits of said bytes of said block are identical,
   (c) means for assigning first of said check bits said second binary value and second of said check bits said first binary value if only the most significant bits of said bytes of said block are identical, and
   (d) means for assigning first of said check bits said second binary value and second of said check bits said second binary value if the most significant bits of said bytes of said block are not identical to each other, and the second most significant bits of said bytes of said block are not identical to each other, and the third most significant bits of said bytes of said block are not identical to each other.

6. The apparatus of claim 1 wherein said means for determining the amount of redundant information associated with said recovered bytes of said recovered block of said second group of blocks is means for ascertaining structural bit patterns among said recovered bytes in said recovered block of said second group of blocks, whereby the greater the conformity of the structural bit patterns among said recovered bytes of said recovered block of said second group of blocks, the greater the amount of redundant information associated with said recovered bytes.

7. The apparatus of claim 6 wherein said means for ascertaining structural bit patterns among said recovered bytes is means for byte-by-byte, bit-by-bit comparison of at least the three most significant bits of said recovered bytes of said recovered block of said second group of blocks.

8. The apparatus of claim 1 wherein said means for re-encoding said amount of redundant information is means for providing at least one check bit associated with said recovered block of said second group of blocks.

9. The apparatus of claim 8 wherein said means for re-encoding said amount of redundant information is means for providing two check bits associated with said recovered block of said second group of blocks, said apparatus further comprising:
(a) means for assigning first of said check bits a first binary value and second of said check bits said first binary value, if the bit patterns of the three most significant bits of each recovered byte of said recovered block are identical,
(b) means for assigning first of said check bits said first binary value and second of said check bits a second binary value, if only the bit patterns of the two most significant bits of said recovered bytes of said recovered block are identical,
(c) means for assigning first of said check bits said second binary value and second of said check bits said first binary value if only the most significant bits of said recovered bytes of said recovered block are identical, and
(d) means for assigning first of said check bits said second binary value and second of said check bits said second binary value if the most significant bits of said recovered bytes of said recovered block are not identical to each other, and the second most significant bits of said recovered bytes of said recovered block are not identical to each other, and the third most significant bits of said recovered bytes of said recovered block are not identical to each other.

10. The apparatus of claim 1 wherein said means for comparing said recovered encoded redundancy signal and said re-encoded redundancy signal is means for determining the equality of said recovered encoded redundancy signal and said re-encoded redundancy signal whereby if said recovered redundancy signal is not equal to said re-encoded redundancy signal at least one error in said recovered bytes of said recovered block of said second group of blocks is detected.

11. The apparatus of claim 10 wherein said error is correctable if said amount of redundant information associated with said encoded redundancy signal is greater than said amount of redundant information associated with said re-encoded redundancy signal.

12. The apparatus of claim 1 wherein said means to effect correction of said correctable errors comprises:
(a) means for determining at least the majority bit pattern among the three most significant bits of said recovered bytes of said recovered block of said second group of blocks to provide an associated exemplar bit pattern, and
(b) means for setting said three most significant bits of all of said recovered bytes of said recovered block of said second group of blocks to conform to said associated exemplar bit pattern, whereby said correctable errors are corrected.

13. The apparatus of claim 1 wherein said means to effect correction of said correctable errors comprises:
(a) means for determining that the three most significant bits of at least two of said recovered bytes of said recovered block of said second group of blocks form identical bit patterns, the bit patterns of the three most significant bits of the remainder of said recovered bytes of said recovered block of said second group of blocks being all different, and
(b) means for setting said three most significant bits of all of said recovered bytes of said recovered block of said second group of blocks to conform to said identical bit pattern, whereby said correctable errors are corrected.

14. The apparatus of claim 1 wherein said means for merging said encoded redundancy signal with said bytes of said first group of blocks further comprises means for delaying said encoded redundancy signal prior to merging said encoded redundancy signal with said first group of blocks.

15. The apparatus of claim 1 wherein said means for recovering said bytes from said composite assemblage further comprises means for delaying said bytes relative to said recovered redundancy signal.

16. Apparatus adapted for correction of errors in pictorial image data said apparatus comprising:
(a) means for deriving said image data from said pictorial image,
(b) means for grouping said image data into data blocks,
(c) means for determining the amount of redundant information associated with said image data in each of said data blocks,
(d) means for representing said amount of redundant information by at least one check bit associated with each block,
(e) means for merging said check bit with said image data, to provide a composite assemblage of said image data cooperative with said check bit,
(f) means for recovering said check bit from said composite assemblage, to provide a recovered check bit,
(g) means for recovering said image data from said composite assemblage, to provide recovered image data,
(h) means for grouping said recovered image data into data segments,
(i) means for determining the amount of redundant information of said recovered image data associated with each of said data segments,
(j) means for representing said amount of redundant information of said recovered image data in each of said data segments by a re-encoded check bit,
(k) means for comparing said recovered check bit with said re-encoded check bit, whereby errors in said recovered image data comprising said data segment are detectable, (l) means for determining correctability of said errors, whereby correctable errors in said recovered image data comprising said data segment are identified, and (m) means for correcting said correctable errors wherein the said recovered image data comprising said data segment is modified to effect the restoration of said amount of redundant information associated with said recovered image data comprising said data segment to equal that amount of redundant information associated with said image data of said data block as encoded by said recovered check bit.

17. Method of error correction of digital data characterized by redundant information associated therewith, said method comprising:

(a) assembling said digital data into bytes comprised of a discrete number of bits, (b) aggregating said bytes into blocks of a predetermined number of bytes per block to comprise a first group of blocks, (c) determining the amount of said redundant information associated with said bytes of a block of said first group of blocks, (d) encoding said amount of redundant information to provide an encoded redundancy signal for said block of said first group of blocks, (e) merging said encoded redundancy signal with said bytes of said first group of blocks to provide a composite assemblage of said encoded redundancy signals and said bytes, (f) recovering bytes from said composite assemblage to provide recovered bytes, (g) recovering an encoded redundancy signal associated with said recovered bytes from said composite assemblage, to provide a recovered redundancy signal, (h) organizing said recovered bytes into recovered blocks to comprise a second group of blocks, whereby said recovered blocks comprise said recovered bytes in correspondence with said bytes comprising said first group of blocks, (i) determining amount of redundant information associated with said recovered bytes in a recovered block, (j) representing said amount of redundant information in said recovered bytes of said recovered block as a re-encoded redundancy signal, (k) comparing said recovered encoded redundancy signal with said re-encoded redundancy signal, whereby correctable errors in said recovered bytes are detected, (l) correcting said correctable errors in said recovered bytes of said recovered block by utilizing said amount of redundant information in said recovered bytes to determine an exemplar, and (m) modifying said recovered bytes of said recovered block of said second group of blocks to conform to said exemplar.

18. Method of encoding redundant digital data, said method comprising the steps of:

(a) grouping said data into at least one block, (b) identifying specific bit patterns in said redundant data in said block, (c) defining a relation between said specific bit patterns and at least one check bit, and (d) assigning said check bit to said block in accordance with said relation whereby said check bit identifies the occurrence of said specific bit patterns in said data in said block.

19. Apparatus for detecting and correcting an error in digital data derived from a pictorial image, said data being characterized by redundancy associated with an essentially uniform segment of said image, wherein said error is associated with a transfer of said data, said apparatus comprising:

(a) means for determination of a first amount of redundancy in said data prior to said transfer, (b) means for determination of a second amount of redundancy in said data subsequent to said transfer, (c) means for comparing said first amount of redundancy to said second amount of redundancy, whereby said error associated with said transfer is detected, and (d) means for modifying said data subsequent to said transfer to restore said first amount of redundancy to said data, whereby said error is corrected.

20. The apparatus of claim 19 wherein said means for determination of said first and said second amounts of redundancy is means for expressing said amounts of redundancy in binary representation wherein the greater the amounts of redundancy of said data the greater the binary representation of said amounts of redundancy.

* * * * *